(12) United States Patent
Lanus et al.

(10) Patent No.: US 7,394,169 B2
(45) Date of Patent: ***Jul. 1, 2008

(54) POWER DISTRIBUTION SYSTEM

(75) Inventors: Mark S. Lanus, Tempe, AZ (US); Bruce A. Hanahan, Marlborough, MA (US); Wolfgang Poschenrieder, Zorneding (DE)

(73) Assignee: Emerson Network Power - Embedded Computing, Inc., Madison, WI (US)

( * ) Notice: Subject to any disclaimer, the term of this patent is extended or adjusted under 35 U.S.C. 154(b) by 256 days.

This patent is subject to a terminal disclaimer.

(21) Appl. No.: 11/287,645

(22) Filed: Nov. 28, 2005

(65) Prior Publication Data

US 2007/0121277 A1 May 31, 2007

(51) Int. Cl.
*H02J 7/00* (2006.01)
*H02J 3/38* (2006.01)

(52) U.S. Cl. .......................... 307/64; 307/19

(58) Field of Classification Search .............. 307/19, 307/64, 65

See application file for complete search history.

(56) References Cited

U.S. PATENT DOCUMENTS 5,861,684 A * 1/1999 Slade et al. ................. 307/66
2006/0238032 A1 * 10/2006 Nitta ........................... 307/64

* cited by examiner

*Primary Examiner*—Michael J Sherry
*Assistant Examiner*—Michael Rutland Wallis
(74) *Attorney, Agent, or Firm*—Harness Dickey & Pierce P.L.C.

(57) ABSTRACT

A power distribution system and method may include a first power domain having a first plurality of power rails, a second power domain having a second plurality of power rails, where the first power domain is electrically independent of the second power domain, and a plurality of modules coupled to the first power domain and the second power domain, where each of the plurality of modules is coupled to one of the first plurality of power rails and one of the second plurality of power rails. The system may also include a plurality of mated pairs, where each of the plurality of modules is in only one of the plurality of mated pairs, and where each of the plurality of mated pairs is coupled to two separate of the first and second plurality of power rails.

18 Claims, 6 Drawing Sheets

POWER DISTRIBUTION SYSTEM

BACKGROUND OF INVENTION

Although an embedded computer system may include redundant cards such that the failure of one card will not cause overall system downtime, power outages can cause an entire chassis or shelf to fail. In the prior art, when one card catastrophically fails, its redundant counterpart is often on the same set of power rails, which can lead to both cards failing. This catastrophic power failure can also lead to other cards failing in the embedded computer system.

There is a need, not met in the prior art, to protect redundant pairs of cards from catastrophic power failure. Accordingly, there is a significant need for an apparatus and method that overcomes the deficiencies of the prior art outlined above.

BRIEF DESCRIPTION OF THE DRAWINGS

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent in light of certain exemplary embodiments recited in the Detailed Description, wherein:

Elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms "first", "second", and the like herein, if any, are used inter alia for distinguishing between similar elements and not necessarily for describing a sequential or chronological order. Moreover, the terms "front", "back", "top", "bottom", "over", "under", and the like in the Description and/or in the Claims, if any, are generally employed for descriptive purposes and not necessarily for comprehensively describing exclusive relative position. Any of the preceding terms so used may be interchanged under appropriate circumstances such that various embodiments of the invention described herein may be capable of operation in other configurations and/or orientations than those explicitly illustrated or otherwise described.

DETAILED DESCRIPTION OF EXEMPLARY EMBODIMENTS

The following representative descriptions of the present invention generally relate to exemplary embodiments and the inventor's conception of the best mode, and are not intended to limit the applicability or configuration of the invention in any way. Rather, the following description is intended to provide convenient illustrations for implementing various embodiments of the invention. As will become apparent, changes may be made in the function and/or arrangement of any of the elements described in the disclosed exemplary embodiments without departing from the spirit and scope of the invention.

Various representative implementations of the present invention may be applied to any system for power distribution. Certain representative implementations may include, for example AC power distribution, DC power distribution, and power distribution in an embedded computer chassis or system of multiple chassis.

For clarity of explanation, the embodiments of the present invention are presented, in part, as comprising individual functional blocks. The functions represented by these blocks may be provided through the use of either shared or dedicated hardware, including, but not limited to, hardware capable of executing software. The present invention is not limited to implementation by any particular set of elements, and the description herein is merely representational of one embodiment.

Software blocks that perform embodiments of the present invention can be part of computer program modules comprising computer instructions, such control algorithms that are stored in a computer-readable medium such as memory. Computer instructions can instruct processors to perform any methods described below. In other embodiments, additional modules could be provided as needed.

A detailed description of an exemplary application is provided as a specific enabling disclosure that may be generalized to any application of the disclosed system, device and method for distribution of power in accordance with various embodiments of the present invention.

Figure 1:
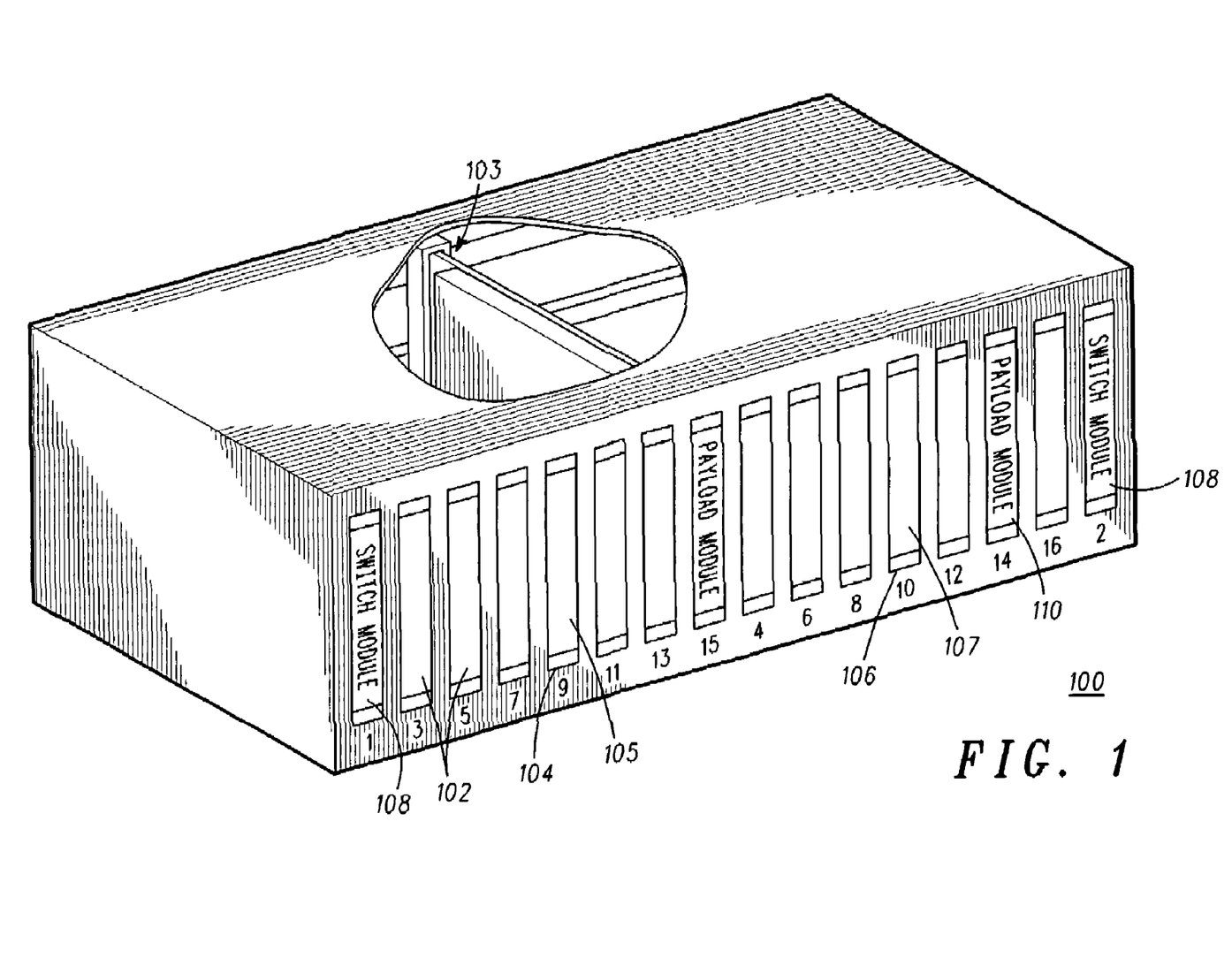
FIG. 1 representatively illustrates an embedded computer chassis in accordance with an exemplary embodiment of the present invention.

FIG. 1 representatively illustrates an embedded computer chassis in accordance with an exemplary embodiment of the present invention. As shown in FIG. 1, embedded computer chassis 100 may include a backplane 103, with software and a plurality of slots 102 for inserting modules, for example, switch modules 108 and payload modules 110. Backplane 103 may be used for coupling modules placed in plurality of slots 102 and power distribution.

As shown in FIG. 1, embedded computer chassis 100 may comprise at least one switch module 108 coupled to any number of payload modules 110 via backplane 103. Backplane 103 may accommodate any combination of a packet switched backplane including a distributed switched fabric or a multi-drop bus type backplane. Bussed backplanes may include VME, CompactPCI, and the like. Payload modules 110 may add functionality to embedded computer chassis 100 through the addition of processors, memory, storage devices, I/O elements, and the like. In other words, payload module 110 may include any combination of processors, memory, storage devices, I/O elements, and the like, to give embedded computer chassis 100 any functionality desired by a user. In the embodiment shown, there are sixteen slots 102 to accommodate any combination of switch modules 108 and payload modules 110. However, an embedded computer chassis 100 with any number of slots may be included in the scope of the invention. For example, embedded computer chassis 100 may include fourteen slots 102 and be within the scope of the invention.

In an embodiment, embedded computer chassis 100 can use switch module 108 as a central switching hub with any number of payload modules 110 coupled to switch module 108. Embedded computer chassis 100 may support a point-to-point, switched input/output (I/O) fabric. Embedded computer chassis 100 may include both node-to-node (for example computer systems that support I/O node add-in slots) and chassis-to-chassis environments (for example interconnecting computers, external storage systems, external Local Area Network (LAN) and Wide Area Network (WAN) access devices in a data-center environment). Embedded computer chassis 100 may be implemented by using one or more of a plurality of switched fabric network standards, for example and without limitation, InfiniBand™, Serial RapidIO™, Ethernet™, AdvancedTCA™, PCI Express™, and the like. Embedded computer chassis 100 is not limited to the use of these switched fabric network standards and the use of any switched fabric network standard is within the scope of the invention.

In one embodiment, backplane 103 can be an embedded packet switched backplane as is known in the art. In another embodiment, backplane 103 can be an overlay packet switched backplane that is overlaid on top of a backplane that does not have packet switched capability. In any embodiment of the invention, switch module 108 may communicate with payload modules 110 via a plurality of links, for example and without limitation, 100-ohm differential signaling pairs.

In an embodiment, embedded computer chassis 100 and backplane 103 can use the CompactPCI (CPCI) Serial Mesh Backplane (CSMB) standard as set forth in PCI Industrial Computer Manufacturers Group (PICMG®) specification 2.20, promulgated by PICMG, 301 Edgewater Place, Suite 220, Wakefield, Mass. CSMB provides infrastructure for applications such as Ethernet, Serial RapidIO, other proprietary or consortium based transport protocols, and the like. In another embodiment embedded computer chassis 100 can use an Advanced Telecom and Computing Architecture (ATCA™) standard as set forth by PICMG. The embodiment of the invention is not limited to the use of these standards, and the use of other standards is within the scope of the invention.

Embedded computer chassis 100 can include multiple power domains coupled to provide power, via backplane 103, to switch modules 108 and payload modules 110. Power domains can supply for example and without limitation, DC voltage to backplane 103 along any number of power rails, bus bars, or conductors. Switch modules 108 and payload modules 110 may be coupled to the power rails on the backplane 103. Multiple power domains may be independent of each other so as to provide independent and redundant power to backplane 103. In other words, multiple power domains may be electrically isolated so as to provide power redundancy to embedded computer chassis 100.

In an embodiment, embedded computer chassis 100 may provide redundancy in the slot configuration by providing that each slot 104 has a corresponding slot 106 such that module 105 in slot 104 has a corresponding module 107 in corresponding slot 106. In an embodiment, module 105 and corresponding module 107 may provide the same function to embedded computer chassis 100 such that module 105 and corresponding module 107 are redundant in embedded computer chassis 100. For example, if module 105 were to cease to function, corresponding module 107 may assume the functions of module 105 without interruption of service. This redundancy may hold for both switch modules and payload modules and provides embedded computer chassis 100 with greater reliability.

In the embodiment shown, slot 1 and slot 2, which may but do not need to correspond to a physical adjacency, may contain switch modules 108 such that the switch modules perform redundant functions. In this embodiment, slot 1 corresponds to slot 2 and the switch module in slot 1 corresponds to the switch module in slot 2. In another embodiment, slot 13 and slot 14, which may but do not need to correspond to a physical adjacency, may contain payload modules 110 such that the payload modules perform redundant functions. In this embodiment, slot 13 corresponds to slot 14 and the payload module in slot 13 corresponds to the payload module in slot 14.

In the embodiment depicted in FIG. 1, slot 1 and corresponding slot 2 are at opposite ends of embedded computer chassis 100 and may be identified by their logical implementation. This separation may be to ensure maximum separation distance between switch modules 108 for increased reliability in case of the failure of one switch module. Other mated pairs of slots may be separated by substantially a half-length of embedded computer chassis 100. For example, logical slot 3 may correspond with logical slot 4 such that slot 3 and corresponding slot 4 are separated by substantially a half-length of embedded computer chassis 100. In another illustrative example, logical slot 9 may correspond with logical slot 10 such that slot 9 and corresponding slot 10 are separated by substantially a half-length of embedded computer chassis 100. The slot locations depicted in FIG. 1 are not limiting of the invention. Other slot configurations that separate slots and corresponding slots by more or less than a half-length of embedded computer chassis are within the scope of the invention.

The number of slots 102 depicted in embedded computer chassis 100 is illustrative and not limiting of the invention. The logical and physical slot designations may be defined by one skilled in the art. Embedded computer chassis 100 may have any number of slots and modules and be within the scope of the invention. Further, although slots and modules are depicted in a vertical orientation, this is not limiting of the invention. Embedded computer chassis 100 may have slots and modules in a horizontal orientation or a combination of horizontal and vertical orientations and be within the scope of the invention.

Figure 2:
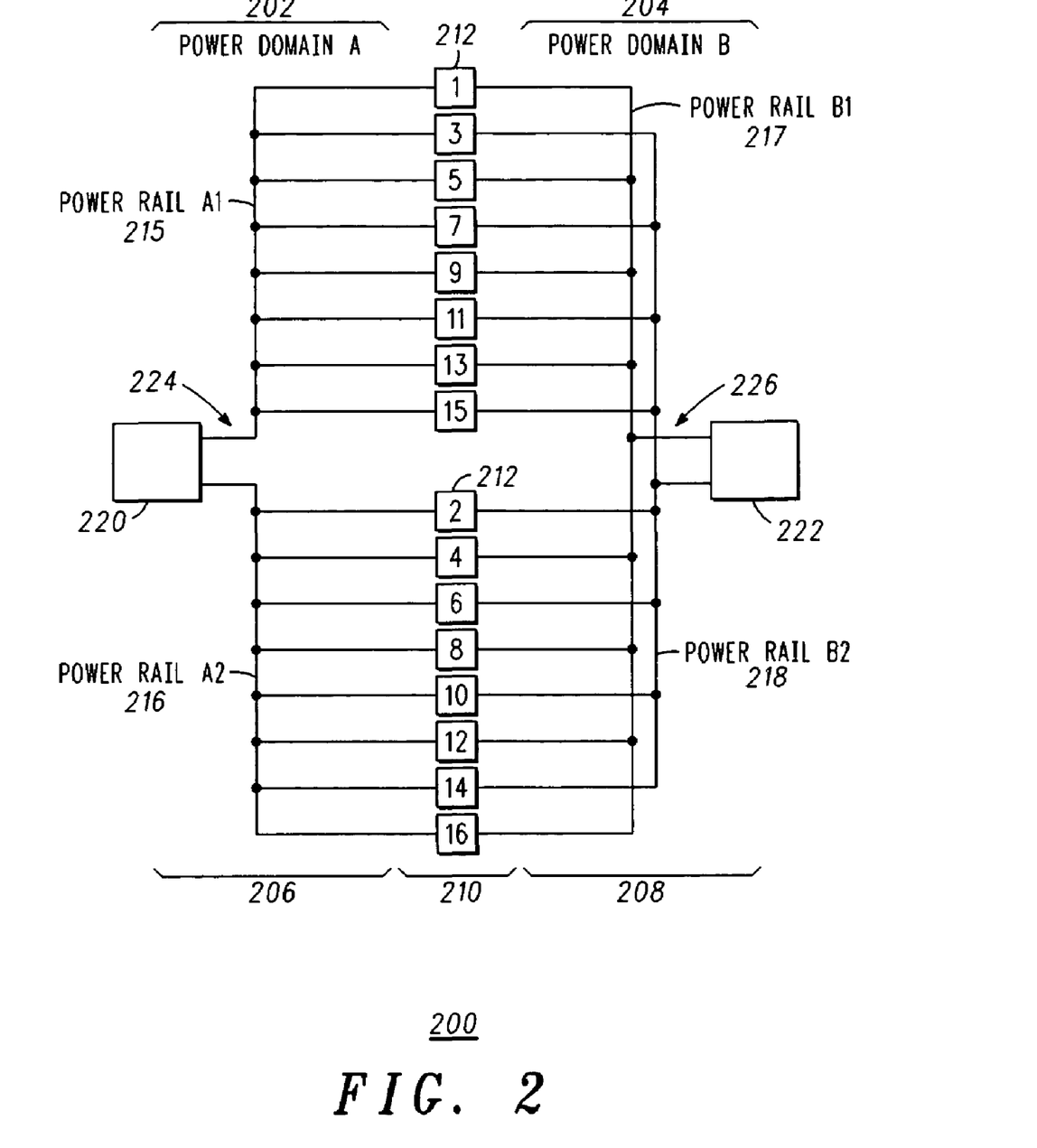
FIG. 2 representatively illustrates a block diagram of a power distribution system in accordance with an exemplary embodiment of the present invention.

FIG. 2 representatively illustrates a block diagram of a power distribution system 200 in accordance with an exemplary embodiment of the present invention. In an embodiment, power distribution system 200 may be implemented in embedded computer chassis 100, but this is not limiting of the invention. Power distribution system 200 may be implemented in other environments and be within the scope of the invention.

As shown in FIG. 2, power distribution system 200 may include a first power domain 202 having a first power entry module 220 and a second power domain 204 having a second power entry module 222. First power domain 202 may include a first plurality of power rails 206, while second power domain 204 may include a second plurality of power rails 208.

First and second power entry modules may function to filter and monitor power entering embedded computer chassis 100 and distribute power to its associated power rails. In an exemplary embodiment, first power entry module 220 and second power entry module 222 may function to filter 100 amp, −48V DC power and distribute to first plurality of power rails 206 and second plurality of power rails 208 respectively.

Distribution to first plurality of power rails 206 may occur over first set of feed lines 224. Distribution to second plurality of power rails 208 may occur over second set of feed lines 226. In an embodiment, feed lines may be synonymous with power rails.

First power domain 202 and second power domain 204 may be independent of each other so as to provide power independently and redundantly to power distribution system 200. In other words, first power domain 202 and second power domain 204 may be electrically isolated so as to provide power redundancy to power distribution system 200.

In an embodiment, first power domain 202 and second power domain 204 may be coupled to plurality of modules 210. In an embodiment, plurality of modules 210 may be switch modules 108, payload modules 110, and the like, as discussed with reference to FIG. 1. In an embodiment, plurality of modules 210 may also belong to plurality of mated pairs 212, where each of the plurality of modules 210 is in only one of the plurality of mated pairs 212. For example, one of plurality of mated pairs 212 may include module 1 and module 2. Another one of plurality of mated pairs 212 may include module 3 and module 4, and so on. In the block diagram embodiment a power distribution system 200 shown in FIG. 2, the upper set of plurality of modules (1, 3, 5, . . . ) corresponds to one of the lower set of plurality of power modules (2, 4, 6, . . . ) to form plurality of mated pairs 212. This is not limiting of the invention as other schematic combinations of modules may form plurality of mated pairs 212 and be within the scope of the invention.

In an embodiment, a module and its corresponding module may provide the same function to embedded computer chassis such that the module and its corresponding module are redundant. For example, if module 1 were to cease to function, corresponding module 2 may assume the functions of module 1 without interruption of service. The module designations of FIG. 2 may be mapped to the slot designations of the system.

In the embodiment shown, each power domain may include two power rails.

First power domain 202 may include two power rails (power rail A1 215 and power rail A2 216), while second power domain 204 may include two power rails (power rail B1 217 and power rail B2 218). Each power rail may supply power to one or more of plurality of modules 210. For example and not limiting of the invention, if 50 amps of current is being fed to each power entry module, then each power rail can supply 25 amps to each connected module.

In an embodiment, power distribution system 200 is coupled to provide a redundant, reliable source of power to each of the plurality of modules 210. To provide this redundancy, each module may be coupled to one power rail from each of the first power domain 202 and the second power domain 204. If one or more of first plurality of power rails 206 in the first power domain 202 or one or more of second plurality of power rails 208 in the second power domain 204 fail, the module will still be able to draw power from the remaining power domain. For example, module 1 is coupled to power rail A1 215 from first plurality of power rails 206 in first power domain 202 and power rail B1 217 from second plurality of power rails 208 in second power domain 204.

In some circumstances, failure of one of the plurality of modules may cause one or both of the power rails coupled to that module to fail. This can have the effect of cutting off power supplied to other modules as well. In some instances, power to both modules in a mated pair can be faulted, thereby causing the functionality of that mated pair to be removed from the system and potentially causing unacceptable system downtime. In order to maximize reliability and minimize the chances for such failures to occur, an embodiment of the invention interleaves the coupling of power rails to plurality of modules 210.

In an embodiment, power rails can be interleaved to plurality of slots 102 via the backplane 103 in an embedded computer chassis 100 so as to provide maximum reliability while supplying redundant power to each of plurality of modules 210 coupled to each of plurality of slots 102. However, this is not limiting of the scope of the invention, as power distribution system 200 may be applied in other environments and using other delivery mechanisms besides a backplane and still be within the scope of the invention.

In an embodiment, interleaving power rails on each of first power domain 202 and second power domain 204 may follow one or more guidelines so as to maximize reliability and minimize the chance that a module-centric failure will disable other modules in the system.

In an embodiment, one guideline for interleaving power rails is that each of the plurality of modules is coupled to one of the first plurality of power rails 206 and one of the second plurality of power rails 208 such that in a mated pair, each module is coupled to two separate of the first and second plurality of power rails. In other words, each module in a mated pair 212 is coupled a different set of power rails from the two power domains. In an exemplary embodiment, each of the plurality of modules 210 may be coupled to a 2-tuple of one of the first plurality of power rails 206 and one of the second plurality of power rails 208. This ensures that no two modules from a mated pair 212 are coupled to the same set of first plurality of power rails and second plurality of power rails.

Table 1 illustrates that the mapping of power rails to modules depicted in FIG. 2 meets the criteria of the guideline above in that all combinations of 2-tuples of power rails <1,1>, <1,2>, <2,1>, <2,2> are accounted for in the entries of the table, where PR-A and PR-B refer to first plurality of power rails (A1,A2) and second plurality of power rails (B1, B2) respectively, and LS-A and LS-B refer to the logical slot/module A (the upper half of plurality of modules) and logical slot/module B of the mated pair (the lower half of plurality of modules) respectively.

TABLE 1

Mapping of Power Rails to Mated Slots (logical slot orientation)

| Power Rails LS-A <PR-A, PR-B> | Mated Slots <LS-A, LS-B> | Power Rails LS-B <PR-A, PR-B> |
|---|---|---|
| <1, 1> | <1, 2> | <2, 2> |
| <1, 2> | <3, 4> | <2, 1> |
| <1, 1> | <5, 6> | <2, 2> |
| <1, 2> | <7, 8> | <2, 1> |
| <1, 1> | <9, 10> | <2, 2> |
| <1, 2> | <11, 12> | <2, 1> |
| <1, 1> | <13, 14> | <2, 2> |
| <1, 2> | <15, 16> | <2, 1> |

Figure 3:
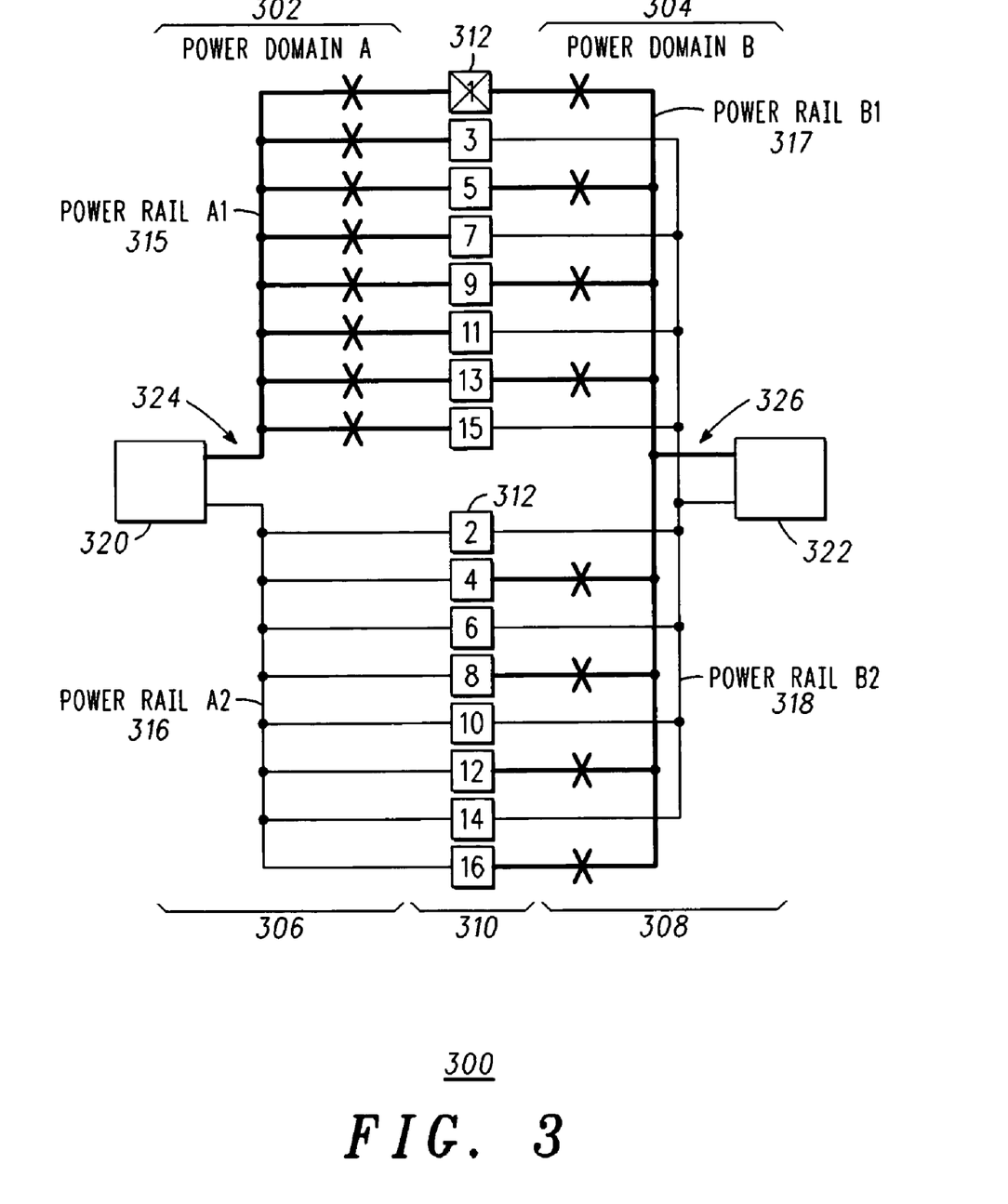
FIG. 3 representatively illustrates a block diagram of a power distribution system in accordance with another exemplary embodiment of the present invention.

FIG. 3 representatively illustrates a block diagram of a power distribution system 300 in accordance with another exemplary embodiment of the present invention. The embodiment, depicted in FIG. 3 represents an analogous power distribution system as that depicted in FIG. 2, where like elements have like numbers. In the embodiment, depicted in FIG. 3, one of the plurality of modules 310 (module 1) is illustrated in a fault condition such as to cause both its power rails to fail as well (the X's and bold lines indicate which module, power rails and connections are failed).

In this embodiment, the failure of module 1 has disabled the two power rails coupled to module 1, so that other modules coupled to these failed power rails cannot receive power from the faulted power rails. As shown, one power rail from each of first plurality of power rails 306 and second plurality of power rails 308 is disabled. The failure of module 1 disables not only module 1, but modules 5, 9 and 13 as well. The dual power rail failure caused by the failure of module 1 has also caused eight other modules (3, 4, 7, 8, 11, 12, 15 and 16) to go into simplex power mode where each of these modules is supplied power by only one active power rail. The remaining four modules (2, 6, 10 and 14) remain in duplex power mode where each is supplied by two active power rails.

The power failure illustrated in FIG. 3, faults sixteen power connections, two on failed module 1, two each on modules 5, 9 and 13, and eight on modules that are now running in simplex (single power supply) power distribution mode (no redundancy). Also, as shown, the failure of module 1 does not disable the mated pair 312, as module 2 is still operational in duplex mode (power redundancy). In sum, the resulting configuration of power distribution system 300 is eight slots/modules running in simplex power distribution mode, four slots/modules running in duplex power distribution mode and four failed slot/module as a result of the dual power rail failure, where no mated pair is failed.

Figure 4:
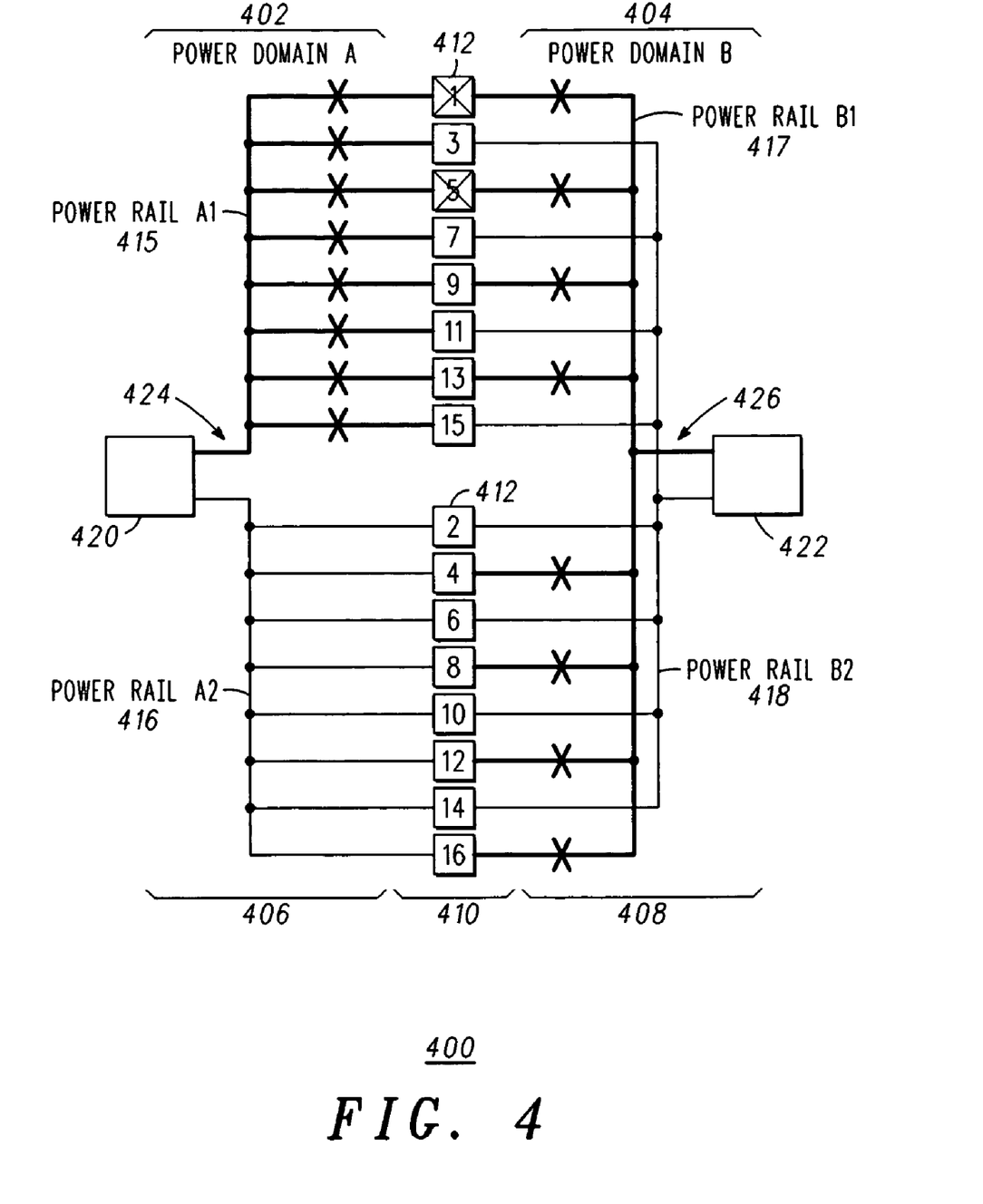
FIG. 4 representatively illustrates a block diagram of a power distribution system in accordance with yet another exemplary embodiment of the present invention.

There are four cases for a first dual power rail failure as described above, depending on which of the two power rails in each domain failed. The first case described above is the failure of power rail A1 415 and power rail B1 417. The second case is the failure of power rail A1 415 and power rail B2 418. The third case is the failure of power rail A2 416 and power rail B1 417. The fourth case is the failure of power rail A2 416 and power rail B2 418. All of these cases have the same effect on the power distribution system 400.

Given these four cases of a first dual power rail failure, there are sixteen cases for a second dual power rail failure depending on the case of the first and second dual power rail failure. The combinations of these two dual power rail failures fall into patterns of the form <Acase, Bcase>, were Acase and Bcase are either "same" or "diff" and indicate whether the two power rail failures in power domain A 402 are on the same or different power rails and whether the two power rail failures in power domain B 404 are on the same or different power rails. Table 2 illustrates mapping of the sixteen possible combinations to <Acase, Bcase> format. For example, if the first dual power rail failure takes out power rail A1 415 and power rail B1 417, and the second dual power rail failure takes out the same two power rails, this would be a <same, same> case as shown in the first row of Table 2.

TABLE 2

Two Dual Power Rail Failures

| First Failure <PR-A, PR-B> | Second Failure <PR-A, PR-B> | Case Name <Acase, Bcase> |
|---|---|---|
| <A1, B1> | <A1, B1> | <same, same> |
| <A1, B1> | <A1, B2> | <same, diff> |
| <A1, B1> | <A2, B1'> | <diff, same> |
| <A1, B1> | <A2, B2> | <diff, diff> |
| <A1, B2> | <A1, B1> | <same, diff> |
| <A1, B2> | <A1, B2> | <same, same> |
| <A1, B2> | <A2, B1> | <diff, diff> |
| <A1, B2> | <A2, B2> | <diff, same> |
| <A2, B1> | <A1, B1> | <diff, same> |
| <A2, B1> | <A1, B2> | <diff, diff> |
| <A2, B1> | <A2, B1> | <same, same> |
| <A2, B1> | <A2, B2> | <same, diff> |

TABLE 2-continued

Two Dual Power Rail Failures

| First Failure <PR-A, PR-B> | Second Failure <PR-A, PR-B> | Case Name <Acase, Bcase> |
|---|---|---|
| <A2, B2> | <A1, B1> | <diff, diff> |
| <A2, B2> | <A1, B2> | <diff, same> |
| <A2, B2> | <A2, B1> | <same, diff> |
| <A2, B2>> | <A2, B2>> | <same, same> |

The following figures and descriptions illustrate exemplary embodiments of the cases put forth in Table 2 on the effects of a second dual power rail failure.

FIG. 4 representatively illustrates a block diagram of a power distribution system 400 in accordance with yet another exemplary embodiment of the present invention. The embodiment, depicted in FIG. 4 represents an analogous power distribution system as that depicted in FIG. 3, where like elements have like numbers.

In the embodiment, depicted in FIG. 4, two of the plurality of modules 410 (module 1 and module 5) are illustrated in a fault condition such as to cause both of their power rails to fail (the X's and bold lines indicate which module, power rails and connections are failed). The embodiment of FIG. 4 illustrates the <same, same> case of dual power rail failure since the failure of both module 1 and module 5 cause power rail A1 415 and power rail B1 417 to fail.

In this embodiment, the failure of module 1 has disabled the two power rails coupled to module 1, so that other modules coupled to these failed power rails cannot receive power from the faulted power rails. The failure of module 5 disables the two power rails coupled to module 5, so that other modules coupled to these failed power rails cannot receive power. Since module 1 and module 5 are coupled to the same set of power rails, the second dual power rail failure (module 5) does not cause any power rail failures past those caused by the failure of module 1. As shown, one power rail from each of first plurality of power rails 406 and second plurality of power rails 408 is disabled. The dual power rail failure of modules 1 and 5 disable not only module 1 and module 5, but modules 9 and 13 as well. The dual power rail failure caused by the failure of module 1 and module 5 has also caused eight other modules (3, 4, 7, 8, 11, 12, 15 and 16) to go into simplex power mode where each of these modules is supplied power by only one active power rail. The remaining four modules (2, 6, 10 and 14) remain in duplex power mode where each is supplied by two active power rails.

The power failure illustrated in FIG. 4, faults sixteen power connections, two each on failed module 1 and module 5, two each on modules, 9 and 13, and eight on modules that are now running in simplex (single power supply) power distribution mode (no redundancy). Also, as shown, the failure of module 1 and module 5 does not disable any mated pairs as modules 1, 5, 9 and 13 are failed but their respective mates 2, 6, 10 and 14 are still operational in duplex mode (power redundancy). In sum, the resulting configuration of power distribution system 400 is eight slots/modules running in simplex power distribution mode, four slots/modules running in duplex power distribution mode and four failed slot/module as a result of the dual power rail failure, where no mated pair is failed. It is clear from this exemplary embodiment, that the failure of two modules and their associated power rails leaves a robust and fully operational power distribution system 400 in place.

Figure 5:
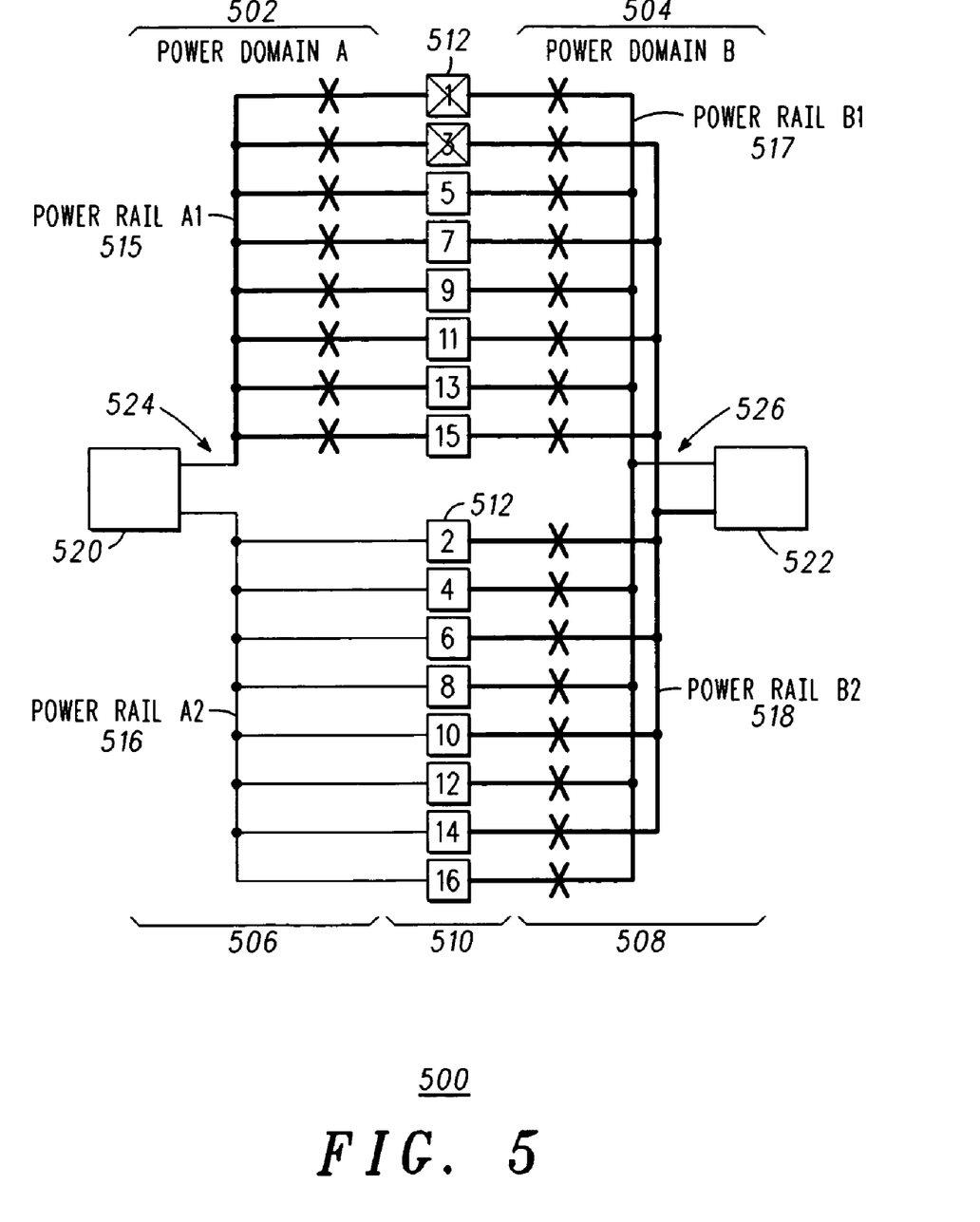
FIG. 5 representatively illustrates a block diagram of a power distribution system in accordance with still another exemplary embodiment of the present invention.

FIG. 5 representatively illustrates a block diagram of a power distribution system 500 in accordance with still another exemplary embodiment of the present invention. The embodiment, depicted in FIG. 5 represents an analogous power distribution system as that depicted in FIG. 3, where like elements have like numbers.

In the embodiment, depicted in FIG. 5, two of the plurality of modules 510 (module 1 and module 3) are illustrated in a fault condition such as to cause both of their power rails to fail (the X's and bold lines indicate which module, power rails and connections are failed). The embodiment of FIG. 5 illustrates the <same, diff> case of dual power rail failure. Both module 1 and module 3 have power rail A1 515 in common, while module 1 utilizes power rail B1 517 and module 3 utilizes power rail B2 518. So the failure of module 1 and module 3 causes the failure of power rail A1 515, power rail B1 517 and power rail B2 518.

In this embodiment, the failure of module 1 has disabled the two power rails coupled to module 1, so that other modules coupled to these failed power rails cannot receive power from the faulted power rails. The failure of module 3 disables the two power rails coupled to module 3, so that other modules coupled to these failed power rails cannot receive power. As shown, one power rail from the first plurality of power rails 506 and two power rails from second plurality of power rails 508 are disabled. The dual power rail failure of modules 1 and 3 disable not only module 1 and module 3, but modules 5, 7, 9, 11, 13 and 15 as well. The dual power rail failure caused by the failure of module 1 and module 3 has also caused the remaining eight modules (2, 4, 6, 8, 10, 12, 14 and 16) to go into simplex power mode where each of these modules is supplied power by only one active power rail. No modules remain in duplex power mode.

The power failure illustrated in FIG. 5, faults twenty four power connections, two each on failed module 1 and module 3, two each on modules, 5, 7, 9, 11, 13 and 15, and eight on modules that are now running in simplex (single power supply) power distribution mode (no redundancy). Also, as shown, the failure of module 1 and module 3 does not cause any mated pairs to fail as modules 1, 3, 5, 7, 9, 13 and 15 are failed but their respective mates 2, 4, 6, 8, 10, 12, 14 and 16 are still operational in simplex mode (no power redundancy). In sum, the resulting configuration of power distribution system 500 is two failed modules, six failed slots/modules as a result of the two dual power rail failures and eight slots/modules running in simplex power distribution mode, where no mated pair is failed. It is clear from this exemplary embodiment, that the failure of two modules and their associated power rails leaves a robust and fully operational power distribution system 500 in place.

Figure 6:
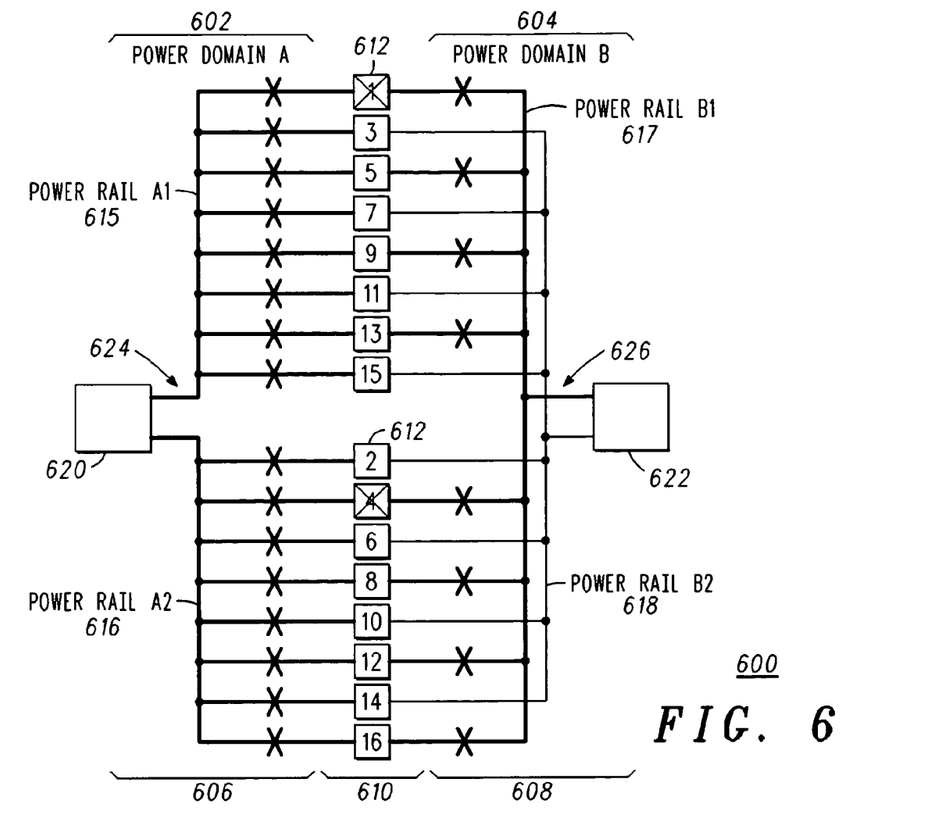
FIG. 6 representatively illustrates a block diagram of a power distribution system in accordance with still yet another exemplary embodiment of the present invention.

FIG. 6 representatively illustrates a block diagram of a power distribution system 600 in accordance with still yet another exemplary embodiment of the present invention. The embodiment, depicted in FIG. 6 represents an analogous power distribution system as that depicted in FIG. 3, where like elements have like numbers.

In the embodiment, depicted in FIG. 6, two of the plurality of modules 610 (module 1 and module 4) are illustrated in a fault condition such as to cause both of their power rails to fail (the X's and bold lines indicate which module, power rails and connections are failed). The embodiment of FIG. 6 illustrates the <diff, same> case of dual power rail failure. Module 1 is coupled to power rail A1 615, while module 4 is coupled to power rail A2 616. However both module 1 and module 4 have power rail B1 617 in common. So the failure of module 1 and module 4 causes the failure of power rail A1 615, power rail A2 616 and power rail B1 617.

In this embodiment, the failure of module 1 has disabled the two power rails coupled to module 1, so that other modules coupled to these failed power rails cannot receive power from the faulted power rails. The failure of module 4 disables the two power rails coupled to module 4, so that other modules coupled to these failed power rails cannot receive power. As shown, two power rails from the of first plurality of power rails 606 and one power rail from second plurality of power rails 608 are disabled. The dual power rail failure of modules 1 and 4 disable not only module 1 and module 4, but modules 5, 8, 9, 12, 13 and 16 as well. The dual power rail failure caused by the failure of module 1 and module 4 has also caused the remaining eight modules (2, 3, 6, 7, 10, 11, 14 and 15) to go into simplex power mode where each of these modules is supplied power by only one active power rail. No modules remain in duplex power mode.

The power failure illustrated in FIG. 6, faults twenty four power connections, two each on failed module 1 and module 4, two each on modules, 5, 8, 9, 12, 13 and 16, and eight on modules that are now running in simplex (single power supply) power distribution mode (no redundancy). Also, as shown, the failure of module 1 and module 4 does not cause any mated pairs to fail as modules 1, 4, 5, 8, 9, 12, 13 and 16 are failed but their respective mates 2, 3, 6, 7, 10, 11, 14 and 15 are still operational in simplex mode (no power redundancy). In sum, the resulting configuration of power distribution system 600 is two failed modules, six failed slots/modules as a result of the two dual power rail failures and eight slots/modules running in simplex power distribution mode, where no mated pair is failed. It is clear from this exemplary embodiment, that the failure of two modules and their associated power rails leaves a robust and fully operational power distribution system 500 in place.

Although not shown or discussed, the <diff, diff> case disables all four power rails and consequently disables all slots/modules as well. Since all power and all slots/modules are disabled in this case, no discussion is warranted.

The above exemplary embodiments illustrate the robustness of the interleaved power distribution system depicted in FIGS. 2-6. FIG. 3 depicts a power distribution system with slots supplied in both simplex and duplex modes after the first dual rail power fault. FIGS. 4-6 depict a power distribution system with slots supplied in simplex mode after two dual rail power faults.

Table 3 summarizes the results of the two dual power rail failure cases. The expected case and the weighted probability of occurrence show that nine blades fail, five blades enter simplex power mode, one blade remains in duplex power mode, and two mated pairs of blades fail. In 75% of the two dual power rail failures, no mated pairs are lots, and therefore, no service-providing capacity of the chassis is lost. This indicates an extremely robust power distribution system in the unlikely event of two dual power rail failures.

TABLE 3

Summary of Two Dual Power Rail Failures

| Case Name | Probability | Number of Blades Fail | Number of Blades in Simplex Power | Number of Blades in Duplex Power | Number of Mated Pairs Fail |
|---|---|---|---|---|---|
| <same, same> | 0.25 | 4 | 4 | 4 | 0 |
| <same, diff> | 0.25 | 8 | 8 | 0 | 0 |
| <diff, same> | 0.25 | 8 | 8 | 0 | 0 |
| <diff, diff> | 0.25 | 16 | 0 | 0 | 8 |
| Expected Case | | 9 | 5 | 1 | 2 |

Figure 7:
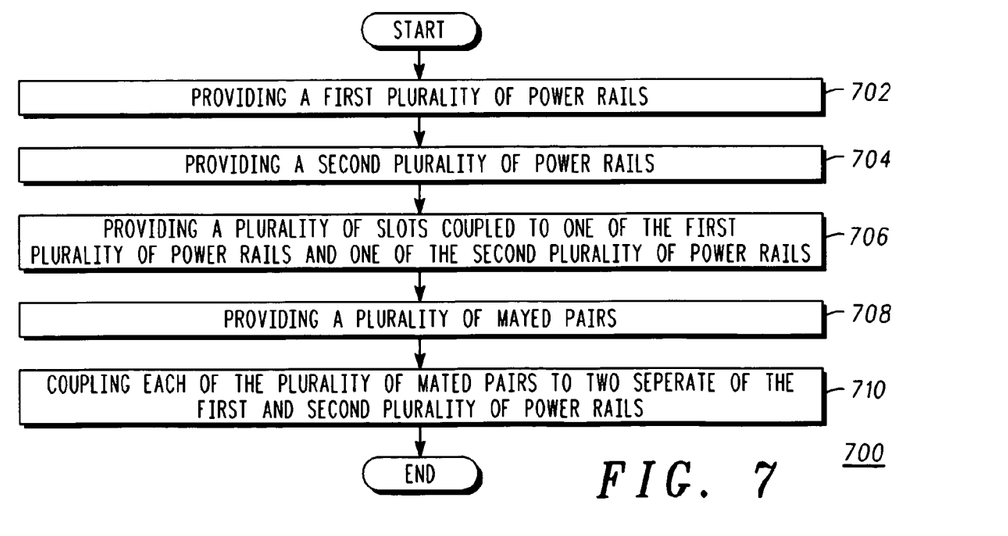
FIG. 7 representatively illustrates a flow diagram in accordance with an exemplary embodiment of the present invention.

FIG. 7 representatively illustrates a flow diagram 700 in accordance with an exemplary embodiment of the present invention. Step 702, provides a first plurality of power rails residing substantially in the backplane. In an embodiment, the backplane may reside in an embedded computer chassis. Step 704 provides a second plurality of power rails residing substantially in the backplane, where the first plurality of power rails is electrically independent of the second plurality of power rails.

Step 706 provides a plurality of slots coupled to one of the first plurality of power rails and one of the second plurality of power rails, while step 708 provides a plurality of mated pairs, where each of the plurality of slots is in only one of the plurality of mated pairs. In step 710, each of the plurality of mated pairs is coupled to two separate of the first and second plurality of power rails.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above.

For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problem or any element that may cause any particular benefit, advantage or solution to occur or to become more pronounced are not to be construed as critical, required or essential features or components of any or all the claims.

As used herein, the terms "comprise", "comprises", "comprising", "having", "including", "includes" or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, manufacturing specifications, design parameters or other operating requirements without departing from the general principles of the same.

We claim:

1. A power distribution system, comprising:
a first power domain having a first plurality of power rails;
a second power domain having a second plurality of power rails, wherein the first power domain is electrically independent of the second power domain;
a plurality of modules coupled to the first power domain and the second power domain, wherein each of the plurality of modules is coupled to one of the first plurality of power rails and one of the second plurality of power rails; and
a plurality of mated pairs, wherein each of the plurality of modules is in only one of the plurality of mated pairs, wherein each of the plurality of mated pairs is coupled to two separate of the first and second plurality of power rails.

2. The power distribution system of claim 1, wherein a module in a mated pair is operationally redundant with a corresponding module in the mated pair.

3. The power distribution system of claim 2, wherein the module and the corresponding module are at least one of a payload module and a switch module.

4. The power distribution system of claim 1, wherein the plurality of modules are one of ATCA and CPCI modules.

5. The power distribution system of claim 1, wherein the first and second plurality of power rails reside substantially in a backplane.

6. The power distribution system of claim 1, wherein the first and second plurality of power rails have a DC voltage.

7. An embedded computer chassis having a backplane, the embedded computer chassis comprising:
a first plurality of power rails residing substantially in the backplane;
a second plurality of power rails residing substantially in the backplane, wherein the first plurality of power rails is electrically independent of the second plurality of power rails;
a plurality of slots coupled to one of the first plurality of power rails and one of the second plurality of power rails; and
a plurality of mated pairs, wherein each of the plurality of slots is in only one of the plurality of mated pairs, wherein each of the plurality of mated pairs is coupled to two separate of the first and second plurality of power rails.

8. The embedded computer chassis of claim 7, wherein each of the plurality of slots is coupled to receive a module.

9. The embedded computer chassis of claim 7, wherein each of the plurality of slots in a mated pair is coupled to receive a module which is operationally redundant with a corresponding module coupled to the mated pair.

10. The embedded computer chassis of claim 9, wherein the module and the corresponding module are at least one of a payload module and a switch module.

11. The embedded computer chassis of claim 7, wherein the embedded computer chassis is one of an ATCA and CPCI embedded computer chassis.

12. The embedded computer chassis of claim 7, wherein the first and second plurality of power rails have a DC voltage.

13. A method of distributing power in an embedded computer chassis, comprising:
providing a first plurality of power rails residing substantially in a backplane;
providing a second plurality of power rails residing substantially in the backplane, wherein the first plurality of power rails is electrically independent of the second plurality of power rails;
providing a plurality of slots coupled to one of the first plurality of power rails and one of the second plurality of power rails;
providing a plurality of mated pairs, wherein each of the plurality of slots is in only one of the plurality of mated pairs; and
coupling each of the plurality of mated pairs to two separate of the first and second plurality of power rails.

14. The method of claim 13, wherein each of the plurality of slots is coupled to receive a module.

15. The method of claim 13, further comprising coupling each of the plurality of slots in a mated pair to receive a module which is operationally redundant with a corresponding module coupled to the mated pair.

16. The method of claim 15, wherein the module and the corresponding module are at least one of a payload module and a switch module.

17. The method of claim 13, wherein the embedded computer chassis is one of an ATCA and CPCI embedded computer chassis.

18. The method of claim 13, further comprising the first and second plurality of power rails having a DC voltage.

* * * * *